US006440625B1

(12) United States Patent
Berlin

(10) Patent No.: US 6,440,625 B1
(45) Date of Patent: Aug. 27, 2002

(54) METHOD OF ELECTROSTATIC RECORDING ON A CYLINDRICAL PHOTORECEPTOR WITH DIELECTRIC COATING AND AN ELECTROPHOTOGRAPHIC DUPLICATING APPARATUS

(75) Inventor: Genady Berlin, Tel Aviv (IL)

(73) Assignee: Elfotek Ltd., Rosh Ha'ayin (IL)

( * ) Notice: Subject to any disclaimer, the term of this patent is extended or adjusted under 35 U.S.C. 154(b) by 0 days.

(21) Appl. No.: 09/483,042

(22) Filed: Jan. 13, 2000

(51) Int. Cl.[7] ............................................... G03G 13/24
(52) U.S. Cl. ......................... 430/55; 399/177; 399/220
(58) Field of Search ........................... 430/55; 399/177, 399/220

(56) References Cited

U.S. PATENT DOCUMENTS

| 3,815,145 A | * | 6/1974 | Tisch et al. ................. 347/123 |
| 4,327,167 A | | 4/1982 | Tanabe ........................ 430/31 |
| 4,371,539 A | | 2/1983 | Stein ........................... 424/272 |
| 4,371,599 A | | 2/1983 | Lind et al. .................... 430/49 |
| 5,470,644 A | | 11/1995 | Durant ........................ 428/209 |
| 5,494,764 A | | 2/1996 | Hyodo ........................ 430/31 |
| 5,576,135 A | | 11/1996 | Nishikawa .................. 430/126 |
| 5,995,795 A | | 11/1999 | Berlin ......................... 399/313 |

OTHER PUBLICATIONS

"Applications of Multi–beam Acousto–optical Modulators in Laser–electrophotographic Printing and Drawing Machines", S. B. Tokes, Computer and Automation Institute, Hungarian Academy of Sciences, Budapest, Hungary.

* cited by examiner

Primary Examiner—Mark Chapman
(74) Attorney, Agent, or Firm—Fitch, Even, Tabin & Flannery

(57) ABSTRACT

A method of electrostatic recording on a cylindrical photoreceptor with a dielectric coating of a photosemiconductor layer is presented. The method includes such main operational steps as charging, exposure and illumination of the photoreceptor, wherein the exposure is carried out by means of optical image scanning along a helix line. This method provides for use of the electrophotography for production of PCBs and printing matrices.

23 Claims, 5 Drawing Sheets

METHOD OF ELECTROSTATIC RECORDING ON A CYLINDRICAL PHOTORECEPTOR WITH DIELECTRIC COATING AND AN ELECTROPHOTOGRAPHIC DUPLICATING APPARATUS

FIELD OF THE INVENTION

This invention is in the field of electrophotography and relates to a method for electrostatic recording on a cylindrical photoreceptor with dielectric coating and an electrophotographic apparatus for multiple-copy production utilizing this method. The invention is particularly useful in the creation of large-format copying equipment, as well as highly productive equipment for the manufacture of printed circuit boards (PCBs) and polygraphic matrices.

BACKGROUND OF THE INVENTION

The electrophotographic process is predominantly used for easy and quick image reproduction or copying. The ability of technology to reproduce/copy an image onto different materials serving as the final information carrier enables the use of electrophotographic methods of copying in different technical fields. One of these fields is the field of printed circuit boards (PCBs) production.

The PCB production process is the process of creating a pattern of conductors on a carrying dielectric basis. The traditional process of PCB production typically consists of the following main stages:

(1) depositing a special photoresist material onto the copper-foiled surface of a plate;

(2) applying optical means to form a required conductive pattern which is created due to the polymerization of the photoresist material within the image regions;

(3) removing the photoresist material from the non-exposed regions (i.e., spaces between the image regions);

(4) applying chemical etching to remove the copper foil from the non-exposed regions;

(5) removing the photoresist material from the image regions (stripping the current conductors).

There exists a number of technical solutions for pattern creation on a foil-coated plate by means of electrophotography. These solutions utilize either direct or indirect processes of electrophotographic copying. For example, U.S. Pat. Nos. 4,327,167 and 5,494,764 disclose a technique of PCBs production by means of a direct method of electrophotographic copying. For this purpose, a photo-semiconductive film is preliminary deposited on the foiled surface of a plate, which thereby is transformed into a photoreceptor. The printing process comprises the stages of electrostatic charging, exposure, development of a latent electrostatic image by a toner, and the toner fixation on the surface of the photo-semiconductive layer. Thereafter, the photo-semiconductive material is removed from the blanked regions, and selective chemical etching and stripping of the current conductors are carried out. It is evident that such cumbersome and relatively expensive technology has no essential advantages over the conventional one.

The application of the indirect process of electrophotographic copying using a photoreceptor as an intermediate image carrier is more effective. However, in this case, other problems arise associated mostly with the ability for high-quality reproduction of large-format images and the realization of a process of toner-image transfer from the photoreceptor surface onto a conductive information carrier. It is evident that a method of electrostatic transfer in the corona-discharge field which is widely used in the electrophotographic technique, as well as other known methods of the toner-image transfer onto a dielectric information carrier (paper, film, etc.) are not applicable for the manufacture of PCBs. For this reason, the known techniques of the kind specified utilize the adhesion-based transfer, wherein the forces of toner adhesion to the surface of a receiving material should exceed the forces of electrostatic attraction that hold the toner particles on the surface of the photoreceptor. These techniques are disclosed for example in U.S. Pat. Nos. 4,371,599; 5,470,644 and 5,576,135.

According to the technique disclosed in U.S. Pat. No. 5,470,644, the direct, adhesive toner transfer onto the PCB surface is used, wherein the PCB surface is coated with ink aimed at improving its adhesion properties. However, this technique suffers from the fact that the processes of preliminary PCB coating and subsequent ink removal before etching still remain. Additionally, this technique practically does not provide the full transfer of a toner-image, which may lead to intolerable defects in the image causing discontinuities in the conductive elements of the PCB.

The above drawbacks are eliminated to a considerable degree, when using a thermal method of the adhesive transfer of a thermoplastic toner, as disclosed, for example, in U.S. Pat. No. 4,371,599. In this case, the toner heating during the process of transfer increases the cohesion between the toner particles and its adhesion to the "bare" receiving surface of the PCB. However, such a thermal process is characterized by contradictory conditions of the process realization: On one hand, to provide the complete toner transfer, a high heating temperature of the receiving material should be provided (up to 250° C.), depending on the melting temperature of the toner and the given technological speed of the process. On the other hand, the photo-semiconductive layers used in photoreceptors are known as very sensitive to high temperatures, such that their parameters are sharply reduced even at temperatures of about 30° C.–40° C.

Furthermore, under such conditions that the photo-semiconductive surfaces of a photoreceptor directly contact the receiving surface of a rigid metal information carrier, unavoidable mechanical damages of the photo-semiconductive layer and sequential electrical breakage occur. This immediately makes the photo-semiconductive layer useless for further operation. The sources and kinds of damages can be different (pilling, scratches, etc.). For this reason, the thermal transfer based electrophotographic apparatuses usually utilize an intermediate, thermal, rubberized cylinder or a heated belt conveyor (as disclosed in U.S. Pat. No. 5,576,135), which is installed between a photoreceptor and the receiving surface of a final information carrier, and which should be equipped with a thermostatic system. In this case, the operational conditions of the photoreceptor are partially simplified, but the construction of the entire apparatus becomes significantly complicated, and the probability of the image quality degradation increases due to the double transfer process. Furthermore, to provide the required temperature mode for the toner image transfer from a heated drum onto a metal surface possessing high heat-conductivity, this surface should be preliminary heated. However, the combination of the thermal transfer processes with the simultaneous toner image fixation on the metal surface, does not guarantee the sufficient quality of the fixation, owing to the fact that these processes have different optimal temperature modes.

In view of the above, it appears that one of the main reasons limiting the application of an electrophotographic process for the manufacture of PCBs is the absence of an effective system for the toner-image transfer from the photoreceptor surface to the conductive receiving surface. For this reason, none of the existing electrophotography-based techniques for PCB production, is practically applied in industrial PCB production equipment.

The conditions of realization of the transfer process to a conductive surface can be significantly simplified when using a photoreceptor with a protective dielectric coating of the photo-semiconductive layer. This allows for carrying out the direct contact transfer of a toner-image from the surface of the photoreceptor directly onto the conductive surface of an information carrier.

Electrophotographic processes of the latent electrostatic image formation on a photoreceptor with a dielectric coating of the photo-semiconductive layer are known, such as Canon process, Katsuragawa process, Hall process). They are based on a certain sequence of the realization of separate stages of the electrostatic recording. In this case, the exposure process is carried out either by means of the conventional slot image projection technique, or by the beam scanning of the image along the width of the copying region (along the generating line of the cylindrical photoreceptor). Here, the copying process is typically performed in a cyclic mode, the surface of the cylindrical photoreceptor sequentially undergoing all the stages of the electrophotographic process during a single revolution.

However, in some cases, for the parameter optimization, the realization speeds of some stages of the electrophotographic process have to be decreased or increased. Such a problem is solved, for example, when using a multiple-copy production method, in which the process of the latent electrostatic image formation and the process of copy production are timely separated. This is disclosed in U.S. Pat. No. 5,995,795 assigned to the assignee of the present application. The necessary condition for carrying out this method is the maintenance of the potential relief of a latent electrostatic image at the given level during the entire process of multiple-copy production, that is during a certain period of time. This condition is provided when using a photoreceptor with a dielectric coating of the photo-semiconductive layer.

Separation between the processes of electrostatic recording and printing allows for applying non-traditional systems of optical scanning of the copying image for the formation of a latent electrostatic image. However, this can be carried out with correspondingly varying the conditions of the electrostatic recording process and of the entire electrophotographic process.

For example, a system of the image exposure on a photoresist material supported on the outer surface of a rotating cylinder is known, in which the optical image scanning is performed along a helix by moving a recording head along the generating line of the cylinder. Such a system is characterized by the high quality recording of large-format images, and is used in the manufacture of polygraphic printed matrices, as well as phototools for the PCB manufacture.

Various examples of the known systems of laser exposure are disclosed in the following article S. B. Tokes "*Applications of multi-beam acousto-optical modulators in laser-electrophotographic printing and drawing machines*", Proceedings, Vol. 396, Advances in Laser Scanning and Recording, Apr. 19–20, 1983, Geneva, Switzerland. These systems utilize optical schemes with longitudinal image scanning along the generating line of the cylindrical photoreceptor, and with transverse image scanning along a helical line on a cylindrical surface covered by a photoresist film.

It is evident that the exposure technique based on a transverse image scanning is not applicable for the traditional electrophotographic processes of the latent electrostatic image formation. This is due to the fact that the optical scanning along a helical line excludes the cyclic nature of the electrophotographic copying process, and the time intervals in sequence and duration of different stages in the process of electrostatic recording at different regions of the photoreceptor surface cannot thereby be maintained.

Thus, to carry out the electrophotographic copying process by applying the optical image scanning along a helix line, two main conditions should be satisfied, as follows:

the timely separation between the process of the latent electrostatic image formation on the photoreceptor surface and the printing process, and provision of identical conditions for the potential relief formation on all the regions of the photoreceptor surface. Both may be achieved by the use of a cylindrical photoreceptor with a dielectric coating of the photo-semiconductor layer.

SUMMARY OF THE INVENTION

There is accordingly a need in the art to facilitate the electrophotographic process of multiple-copy production of a large-format original, by providing a novel method and apparatus for electrophotographic copying utilizing optical image scanning along a helix line.

Thus, according to one broad aspect of the present invention, there is provided a method of electrostatic recording on a cylindrical photoreceptor with a dielectric coating, the method comprising the following steps:

(a) charging the photoreceptor;

(b) exposing the photoreceptor;

(c) discharging the photoreceptor in darkness; and (d) flood illumination of the photoreceptor;

wherein said exposing is performed by means of an optical image scanning along a helix line.

According to one embodiment of the invention, the charging of the dielectric surface of the photoreceptor is carried out in darkness up to a given potential level during the entire process of image scanning, and after completing the exposure process, the dielectric surface of the photoreceptor is discharged in darkness by an alternating current corona (AC corona). Thereafter, flood illumination of the photosemiconductor layer is carried out.

According to another embodiment of the invention, the photoreceptor first undergoes a preliminary charging in light by the AC corona, and is then exposed in the operational zone of the AC corona. When the exposure is complete, the photosemiconductor layer is illuminated.

According to another aspect of the present invention, there is provided an electrophotographic apparatus for multiple-copy production of original information, the apparatus comprising:

(i) a cylindrical photoreceptor with a dielectric coating of a photosemiconductor layer;

(ii) a charging device for charging the photoreceptor;

(iii) an exposure device for exposing the photoreceptor, said exposure device being of a kind capable of optical scanning of an image of copying information along a helix line;

(iv) a discharging device for discharging the dielectric surface of the photoreceptor;

(v) an illumination device for illuminating the photosemiconductor layer;

(vi) a development device for developing a latent electrostatic image by a toner;

(vii) a transfer device for transferring a toner-image onto a final information carrier;

(viii) a fixation device for image fixation on the copy;

(ix) a cleaning device for cleaning the dielectric surface of the photoreceptor.

Preferably, the charging device is a wire electrizer coupled to a source of alternating voltage with basic bias, defining a given potential level of charging. The discharging device may also be a wire electrizer coupled to a source of alternating voltage.

The apparatus preferably operates in a cyclic mode, and may have the following cycles; optical recording, by simultaneous operation of the charging and exposure devices; revealing a potential relief, by sequential operation of the discharging and illumination devices; multiple-copy production, by operation of the development, transfer and fixation devices; and restoration, by operating neutralizing and cleaning means. In this case, the charging device is accommodated in an exposure zone. The discharging and illumination devices may serve together as the neutralizing means.

Alternatively, the cyclic mode of operation of the apparatus may comprise the following cycles: charging the photoreceptor with simultaneous flood illumination thereof, by simultaneous operation of the charging device and an additional illumination device; optical recording; by simultaneous operation of the discharging and exposure devices; revealing of a potential relief, by operating the illumination device; multiple-copy production, by operation of the development, transfer and fixation devices only; and restoration, by operation of the neutralizing and cleaning means. In this case, the discharging device is accommodated in an exposure zone. The charging device and the additional lighting device may operate during more than one revolution of the photoreceptor.

According to yet another aspect of the present invention, there is provided a method for electrophotographic copying on an electrically conductive information carrier, the method comprising the steps of:

(1) forming a latent electrostatic image on the surface of a photoreceptor;

(2) developing the image by toner;

(3) transferring a toner-image onto the electrically conductive surface of the information carrier; and (4) fixating the toner-image;

wherein the latent electrostatic image is formed on the photoreceptor laminated by a protecting dielectric coating, and said transferring is carried out by direct electrostatic transfer.

The toner-image transfer from the photoreceptor may be carried out by a contact electrostatic method.

The direct electrostatic transfer is implemented by supplying direct voltage to the electrically conductive information carrier, the supplied voltage having polarity opposite to that of the toner charge and magnitude exceeding a potential level of the electrostatic recording on the dielectric coating of the photoreceptor. Generally, the transferred toner-image may be fixed by a non-contact method.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF A PREFERRED EMBODIMENT

Figure 1:
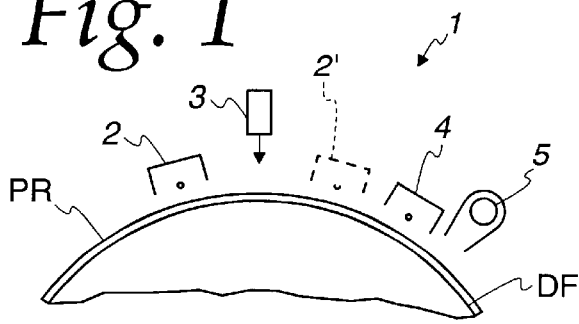
FIG. 1 illustrates a scheme of the main components and their relative disposition of an electrophotographic apparatus utilizing a separated in-time photo-dielectric recording process.

Referring to FIG. 1, there is illustrated a scheme 1 of the relative disposition of electrophotographic devices as used with a separated photodielectric process of electrostatic recording on a photoreceptor PR. Thus, the process of the latent electrostatic image formation on the surface of the photoreceptor PR, whose photosemiconductor layer is coated (laminated) by a dielectric film DF, is performed by the sequential operation (along with the rotation of the photoreceptor PR) of the following devices: a charging device 2, an exposure device 3, a discharging device 4, and an illumination device 5. The charging and discharging electrizers 2 and 4, as well as the illumination device 5, are accommodated along the generating line of the cylindrical photoreceptor PR above its dielectric surface.

The charging electrizer is conditionally shown (in dashed-lines) as being located behind the exposure zone, and is designated 2'. This is associated with the following: during the process of optical image scanning along a helix line, each region on the photoreceptor surface is affected by the charging electrizer 2 both prior to and after the laser exposure along the helix line.

The electrizer 2 should meet the following main requirement: it should provide the uniform charging of the dielectric surface of the photoreceptor PR up to a given potential level, and further maintain this level during the entire process of optical image scanning. This actually presents a device of controllable charging, such as a scorotron, which is usually utilized in an electrophotographic apparatus for providing the equipotentiality of the photoreceptor surface being charged. The discharging device 4 is a corotron coupled to an alternating voltage source (not shown) for creating an AC corona.

Figure 2:
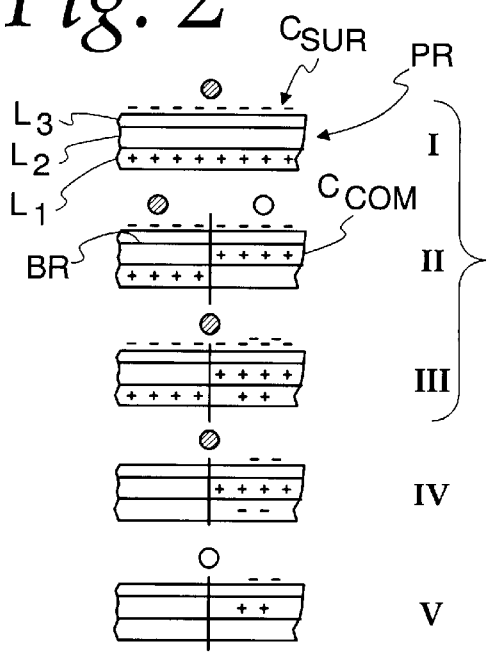
FIG. 2 illustrates the main steps in a process of the latent electrostatic image formation with the separated in-time recording process.

FIG. 2 illustrates the process of latent electrostatic image formation during a separated photodielectric process of recording. As more specifically illustrated here, the photoreceptor PR is composed of an electrically conducting layer $L_1$, and a photosemiconductor layer $L_2$ coated by a transparent dielectric layer $L_3$. Unexposed and exposed regions (zones) are identified by black and white circles.

As shown, at the first stage of the latent electrostatic image formation, surface charges $C_{sur}$ are created by the uniform charging of the entire dielectric surface of the photoreceptor in darkness up to the given potential value. In other words, the equipotentiality of the surface being charged is created. In this case, the charges' injection from the electrically conducting layer $L_1$ (substrate) into the photosemiconductor layer $L_2$ should not occur.

At the second stage, the exposure process takes place, during which light passing through the transparent dielectric layer $L_3$ "opens" the photosemiconductor $L_2$. Owing to the photogeneration and drift processes, the charges' injection takes place in the exposed regions, which results in the generation of compensating charges $C_{com}$ of the opposite sign with respect to that of the surface charges $C_{sur}$ at a boundary region photosemiconductor-dielectric BR. Due to the changes in the effective capacitance, the surface potential within the exposed regions decreases, thereby disturbing the equipotentiality of the surface.

At the third stage, at a new revolution of the cylindrical photoreceptor PR, the exposed region of its surface again enters the effective zone of the charging electrizer 2 (FIG. 1) providing the equipotentiality of the charging surface. At this stage, additional charging in darkness is applied to the regions with the reduced potential level, i.e. the previously exposed regions. As a result, the amount of the surface charges $C_{sur}$ required to provide the uniform surface potential becomes higher within the exposed regions as compared to that of the dark regions. Hence, due to the different density of the surface charges in the light and dark regions, a charge relief is created on the potential surface of the photoreceptor. The exposed regions are characterized by the more stable charged state as compared to that of the dark regions. This is due to the fact that the surface charges in these regions (exposed regions) hold the charges of the opposite sign located in the boundary photosemiconductor-dielectric region BR, thus preventing the dark discharge of the photosemiconductor layer $L_2$ during the entire exposure process.

Since the exposure is carried out along the helix line, the above-described three stages actually present a common manufacturing step, the duration of which is defined by the time required for realization of the optical image scanning. A further, fourth stage, starts after the completeness of this common step.

During the fourth stage, the entire surface of the photoreceptor PR is discharged in darkness up to the zero potential by means of a symmetric AC corona (the discharging device 4). Complete neutralization of charges takes place at the dark regions, while, on the previously exposed regions, the surface charges are redistributed between the dielectric surface and the electrically conducting substrate $L_1$, with respect to the charges of the opposite sign that are located at the boundary photosemiconductor-dielectric BR and remain without any changes in the darkness.

At the fifth stage, as a result of general illumination of the photoreceptor PR, charges from the electrically conducting substrate $L_1$ are injected into the photosemiconductor layer $L_2$. The partial neutralization of charges at the boundary photosemiconductor-dielectric BR occurs, and a charge contrast on the dielectric layer $L_3$ creates a corresponding potential contrast, i.e., the revealing of the potential relief on the photoreceptor surface takes place. A latent electrostatic image so-formed, can be stored for a long period of time, due to the stable polarization of regions in the photosemiconductor layer $L_2$. This is the requirement for providing the subsequent multiple-copy production process.

The potential relief can be revealed by the general illumination of the photoreceptor PR without the discharging stage, as it is performed, for example, in the known Hall process disclosed in U.S. Pat. No. 3,234,019, but in this case, the potential relief is obtained at a high background level which cannot be changed.

Figure 3:
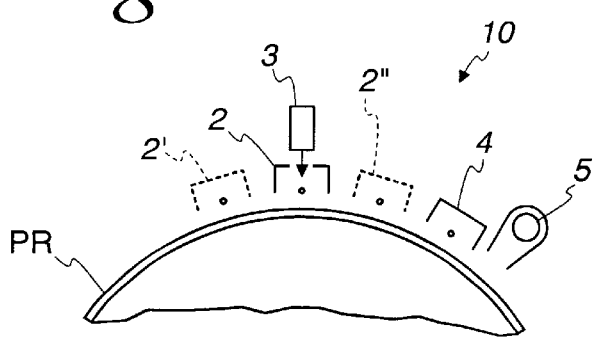
FIG. 3 illustrates a scheme of the main components and their relative disposition of an electrophotographic apparatus utilizing a combined recording process.

Turning now to FIG. 3, there is illustrated a scheme 10 of the relative disposition of electrophotographic devices as used with a combined photodielectric process of electrostatic recording. To facilitate understanding, the same reference numbers are used for identifying those components which are common in the schemes 1 and 10. In distinction to the disposition of the electrophotographic devices according to the separated process based scheme 1, when using the combined process, a laser beam of the exposure device 3 is positioned in a working zone of the open charging electrizer 2 and is moved along this zone. The conditional positions of the charging electrizer in front of and behind the exposure zone are shown in dashed lines and designated 2' and 2". This is associated with that fact that in the process of optical image scanning along a helix line, each surface region of the photoreceptor is affected by the charging electrizer not only during the exposure process but also prior to this process and thereafter.

Figure 4:
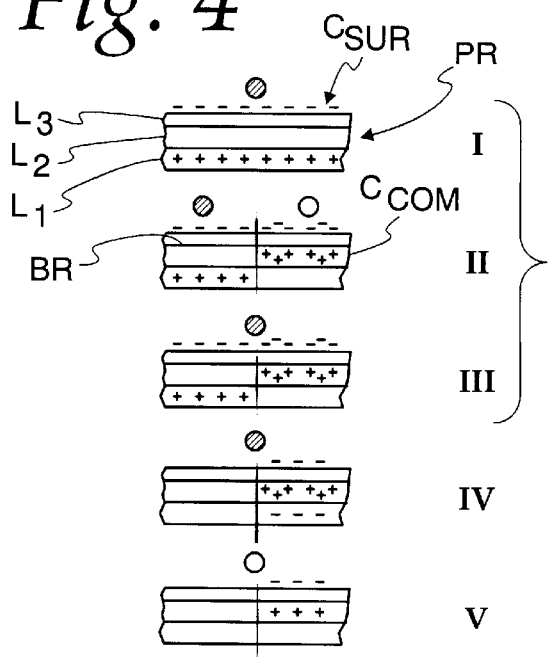
FIG. 4 illustrates the main steps in a process of the latent electrostatic image formation with the combined recording process.

FIG. 4 illustrates the process of the latent electrostatic image formation with the combined photodielectric process of recording. In distinction to the above-described separated process (FIGS. 1 and 2), in the combined process of recording, already at the exposure stage, the simultaneous recharging is performed, the equipotentiality of the surface is provided at the initial given level and charges' relief is formed. The amount of compensating charges at the boundary region photosemiconductor-dielectric BR is increased in the exposed regions of the photoreceptor PR in accordance with the increase in the surface charges' density. The increase of the amount of compensating charges $C_{com}$ at the boundary photosemiconductor-dielectric BR is also influenced by the fact that the charge carriers excited in the photosemiconductor $L_2$ by the lighting effect remain in the conductive zone for a certain period of time after the exposure, whereas the time of charging each point on the surface of the photoreceptor passing through the working zone of the electrizer exceeds the time of its exposure. As a result, the effective time of the exposure stage is increased.

Due to the equipotentiality reached already at the second stage, the next, third stage of the additional charging (at the current revolution of the photoreceptor) does not practically change either the charged or the potential state of the photoreceptor.

At the fourth stage, an enhanced charge contrast is obtained on the surface of the photoreceptor PR, as a result of the discharging thereof by the AC corona, due to the increased amount of charges at the boundary photosemiconductor-dielectric.

At the fifth stage, after the flood illumination, the latent electrostatic image is formed with the enhanced contrast of potentials. Due to the stable polarization of the photosemiconductor layer $L_2$ coated (laminated) with the dielectric layer $L_3$, the obtained potential relief can be preserved for a long period of time, even when using a highly sensitive photosemiconductor layer.

Comparing the photodielectric recording processes for separated (FIG. 2) and combined (FIG. 4) modes, it should be noted that the value of the obtainable contrast of potentials is set at the exposure stage, since it actually depends on the amount of compensating charges formed at the boundary photosemiconductor-dielectric BR during the exposure of the photosemiconductor layer $L_2$. The value of the obtained potential contrast of the latent electrostatic image in the combined recording process is higher than that of the separated recording process. This is due to the fact that electric energy, required for the photogeneration and drift of the charge carriers in the photosemiconductor layer during the exposure process, is supplied from an external circuit through the ion contact of the corona, while in the separated recording process, similar to the classical electrophotography, the energy used is that accumulated by the photosemiconductor layer itself.

Figure 5:
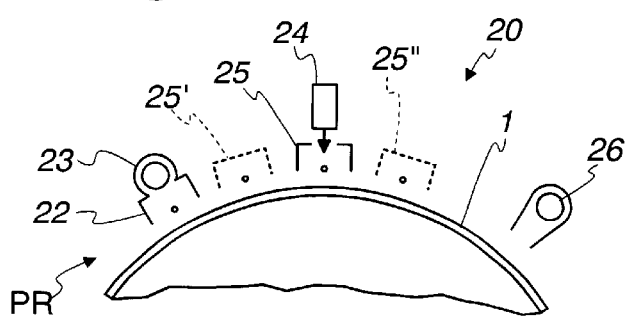
FIG. 5 illustrates a scheme of the electrophotographic devices relative disposition in the combined recording process with a preliminary charging of a photoreceptor.

Referring to FIG. 5, there is illustrated a scheme 20 of the disposition of electrophotographic devices used in the combined photodielectric recording process, which is generally similar to that of FIG. 3, but utilizes preliminary charging of the photoreceptor PR. Here, the realization of the process of latent electrostatic image formation on the surface of the photoreceptor PR is provided by a preliminary charging device 22 combined with a lighting device 23, as well as by an exposure device 24, a discharging device 25 and an illumination device 26. Similar to the previously described example of the combined photodielectric recording process, the conditional locations of the electrizer 25 in front of and behind the exposure zone are shown in dashed lines and designated 25' and 25", since during the process of optical image scanning along a helix line, each region on the photoreceptor surface is affected by the discharging electrizer 25, not only during the exposure process, but also prior to this process and thereafter.

Figure 6:
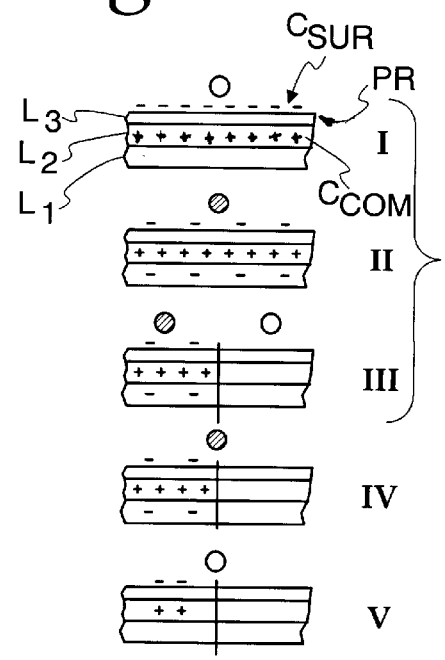
FIG. 6 illustrates the process of the latent electrostatic image formation with the combined recording process and the preliminary photoreceptor charging.

FIG. 6 illustrates the process of the latent electrostatic image formation during the combined photodielectric recording process, utilizing the preliminary charging of the photoreceptor PR. According to previously describe techniques, the charging of the photoreceptor starts almost simultaneously with the beginning of the optical image scanning. In the present example of the combined photodielectric recording process utilizing the preliminary charging of the photoreceptor, the preliminary charging of the entire surface of the photoreceptor up to given potential level with the simultaneous lighting thereof is carried out at an initial stage, prior to the exposure process. In this case, the injection of compensating charge carriers of the opposite sign towards the boundary region photosemiconductor-dielectric BR also occurs.

After the completeness of the preliminary stage of photoreceptor charging, which can be carried out during one or several revolutions of the photoreceptor PR, at the second stage, the discharging of the photoreceptor in darkness to the zero potential is carried out by means of a symmetrical AC corona. In this case, the preliminary sensitiveness is imparted to the photosemiconductor layer $L_2$.

At the third stage, during the exposure process, exposed regions of the photoreceptor PR are fully discharged under the simultaneous affect of light and AC corona, and dark regions retain their charged state. The equipotentiality of the photoreceptor surface is preserved, and a charge relief is created.

The fourth stage does not practically change the charged and potential state of photoreceptor. During the fifth stage, as the result of the flood illumination, the revealing of the potential relief of the latent electrostatic image occurs. Since the fourth stage is a passive one, it can be eliminated by constructional means, for example, by mounting the shortened discharging electrizer 25 onto a carriage of the exposure device 24 displaceable along the generating line of the cylindrical photoreceptor (FIG. 5), or by using a special shutter. This eliminates the position 25'. In this case, the time, during which the AC corona actively affects the photoreceptor after the formation of the charge relief on its surface, is decreased. Due to this, a possible dark discharging of the photosemiconductor layer within the dark regions during the time period between the third and fifth stages will not affect the density of the surface charges $C_{sur}$, and, consequently, the final potentials contrast.

The analogous solution can be applied in the previously described combined photodielectric recording process (FIG. 4), in which it is desired to eliminate the passive third stage (position 2" in FIG. 3). This will favor the creation of the maximal potentials contrast.

Figure 7:
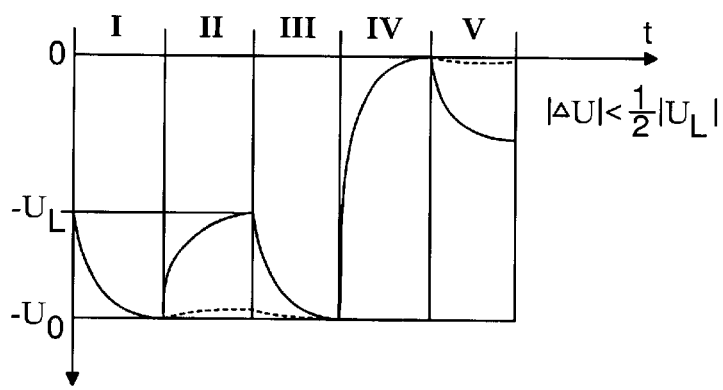
FIG. 7 shows the diagram of surface potential time changes at separate stages with the separated recording process.
Figure 8:
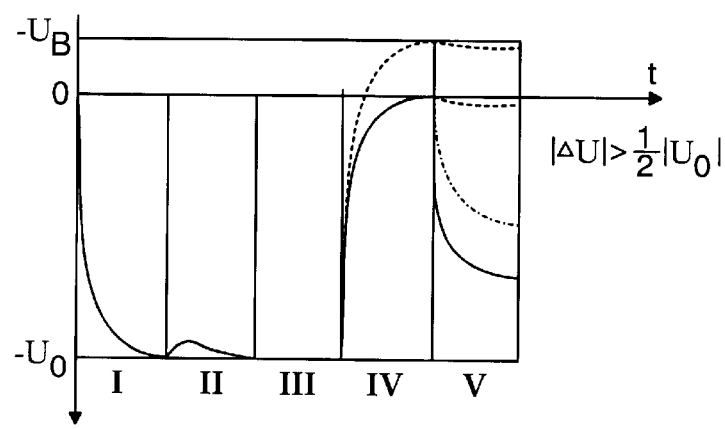
FIG. 8 shows a diagram of surface potential time changes at separate stages with the combined recording process.
Figure 9:
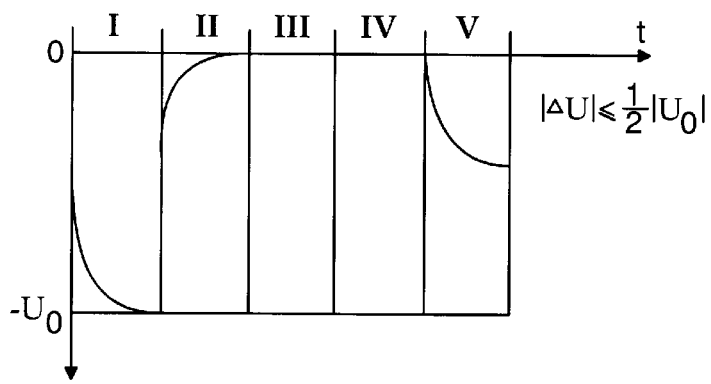
FIG. 9 illustrates a diagram of surface potential time changes at separate stages with the combined recording process and preliminary photoreceptor charging.

FIGS. 7, 8 and 9 represent diagrams of the time changes of surface potential, U, at separate stages in the separated and combined photodielectric recording processes. The ratio of potential values presented in the diagrams is conditional and reflects only the characteristic features of the above-described electrophotographic processes. The time intervals of the separate stages are also conditionally shown as equal, though under the conditions of the optical image scanning along the helix line time intervals of the first and third stages for every point on the photoreceptor surface are not equal, whereas the exposure time (second stage) is incompatibly small.

In both the separated and the combined photodielectric recording processes presented in the diagrams of FIGS. 7 and 8, the charging of the photoreceptor surface up to the given value of the surface potential, $U_0$, is carried out during the first stage. This surface potential is then maintained during the entire period of the optical image scanning.

In the separated recording process (FIG. 7), the decrease in the potential level within the exposed regions occurs during the second stage. The decrease value depends on the ratio of the specific capacitance values of the photosemiconductor and dielectric layers of the photoreceptor. The possible decrease in the potential level at unexposed (background) regions due to the dark current inside the photosemiconductor layer, is shown by dashed lines. At the third stage, the equipotentiality of the photoreceptor surface is restored as the result of a recharging process. At the fourth stage, the surface potential decreases to zero, as the result of the photoreceptor discharging in darkness by the symmetrical AC corona. At the fifth stage of the general illumination, the potential level of the latent electrostatic image reaches approximately a half of the potential level in the exposed regions obtained during the second stage as the result of the exposure process.

In the combined recording process (FIG. 8), at the second stage, the potential decrease in the exposed regions is compensated by a recharging during the exposure process, resulting in the immediate restoration of the potential level. During the third stage, the equipotentiality of the photoreceptor surface is maintained at the initial potential level. During the fourth stage, similar to the separated process, the surface potential decreases to zero, as the result of the photoreceptor discharging in darkness by the symmetrical AC corona. During the fifth stage of the general illumination, the potential relief of the latent electrostatic image is revealed. In this case, the maximal potentials contrast exceeds the half of the initial potential level. Hence, the combined process enables to obtain with the same exposure conditions a higher value of the electrostatic contrast approximately by $(C_{ph}+C_{diel})/C_{ph}$ times, than that of the separated process, wherein $C_{ph}$ and $C_{diel}$ are the specific capacities of the photosemiconductor and dielectric layers, respectively. At the fourth stage, the asymmetry of the AC corona allows for regulating not only the general potential level of the latent electrostetic image, but also the corresponding background level up to changing its polarity. Moreover, at the discharging stage, it is possible to carry out the recharging of the photoreceptor surface by appropriately selecting a constant (basic) component of the asymmetric AC corona, and thereby to change the polarity of the latent electrostatic image. In FIG. 8, dashed lines show an example of photoreceptor recharging by using standard (reference) voltage $U_B$.

FIG. 9 illustrates the main stages of the combined photodielectric recording process with the preliminary charging of the photoreceptor. At the first stage, prior to the beginning of the optical image scanning, the entire working surface of the photoreceptor is uniformly charged at light up to the given potential level. At the second stage, the surface of the photoreceptor is discharged in darkness up to zero potential by means of the symmetrical AC corona. At the third stage during the exposure process and at the fourth stage, assuming that the dark leakage current in the photosemiconductor layer within the unexposed regions is negligible, the potential state of the surface of the photoreceptor can be considered as unchangeable. At the fifth stage of the general illumination, the potential relief is being revealed. In this case, the maximum potential contrast may reach the half of the initial potential level. Similar to the previous combined recording process, the final potential level of the latent electrostatic image can be corrected at the discharging stage.

In all the variations of the electrophotographic process described herein, the provision of the dielectric layer $L_3$ with high electric strength enables the charging of the photoreceptor's surface up to several kilovolts. This enables to increase the initial potential level, and thereby to provide the required value of the potential contrast of the latent electrostatic image. The above-described examples of the photodielectric process of electrostatic recording open wide possibilities for the application of electrophotographic means in systems of large-format copying with a high resolution image.

FIGS. 10A–10E exemplify a principal scheme 30 of the electrophotographic apparatus for multiple-copy production that utilizes the combined process of electrostatic recording (FIG. 3) at its different operational stages (FIG. 4). Thickened lines highlight those devices that operate at each operational stage of the apparatus.

The apparatus 30 comprises a cylindrical photoreceptor 31 with a dielectric coating, a digital scheme of laser exposure of the plotter type with a recording head 32, controllable charging, discharging and illumination devices 33, 34 and 35, technological devices for the image development 36, image transfer and image fixation devices 37 and 38, a cleaning device 39 and transporting rollers 40. The recording head 32 is mounted in the operational zone of the open charging electrizer 33. The optical scanning of the copying image on the photoreceptor 31 is carried out along the helix line by displacing the recording head 32 along the generating line of the rotatable cylindrical photoreceptor 31. The illumination lamp 35 is mounted in the operational zone of the open discharging electrizer 34.

Figure 10A:
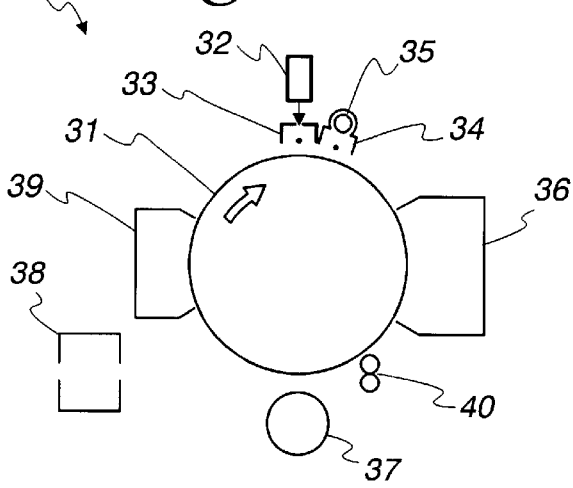
FIG. 10A schematically illustrates an electrophotographic apparatus performing the process of exposure.

FIG. 10A shows the scheme of the electrophotographic apparatus 30 when performing the process of optical image scanning. At this stage, the charging device 33 and the recording head 32 (shown by thickened lines) are in operation, and carry out the first three stages, namely, charging the dielectric surface of the photoreceptor 31 up to the given potential level, exposure, and, simultaneously, additional charging of the exposed regions of the photoreceptor 31.

In the combined photodielectric process, the charging device plays a significant role in providing the equipotentiality of the surface being charged and in the contrast formation. Since the maintenance of the given charge level and the equipotentiality of the dielectric surface of the photoreceptor need to be provided under the condition of a prolonged process of the optical image scanning with a high linear speed of the surface being exposed, the charging device 33 has to meet special requirements.

The application of scorotrons typically used in electrophotographic devices as means for uniform controllable charging is embarrassed in this case. This is associated mainly with the fact that scorotron is known as possessing a relatively low speed of charging, and, under the condition of high linear speed of the surface being charged, works like a regular corotron. Therefore, the apparatus according to the invention utilizes a corotron as the device for controllable uniform charging. The corotron is supplied from a source of alternating voltage with a given bias (not shown). The bias value (reference voltage) determines the constant component of the AC corona, due to which the surface of the photoreceptor is uniformly charged up to the given potential. When the potential of the surface being charged reaches the value of the given bias voltage, the charging current changes its polarity. This excludes the possibility of exceeding the given charging level of the photoreceptor surface, irrespective of the charging process time during the entire period of the optical image scanning.

The stable polarization of the exposed regions obtained during the exposure process generally allows for applying local electrostatic charging means in the combined photodielectric recording process. Such local electrostatic charging means may for example be needle-type charging devices (analogous to those used in electrostatic printing devices), or an electron beam. The use of other charging means does not change the physical essence of the process. However, their application will entail not only numerous constructive and technological difficulties, but also the problem of providing the required equipotentiality of the entire photoreceptor surface being charged, especially with the presence of regions of non-uniformity of the photosemiconductor layer.

Figure 10B:
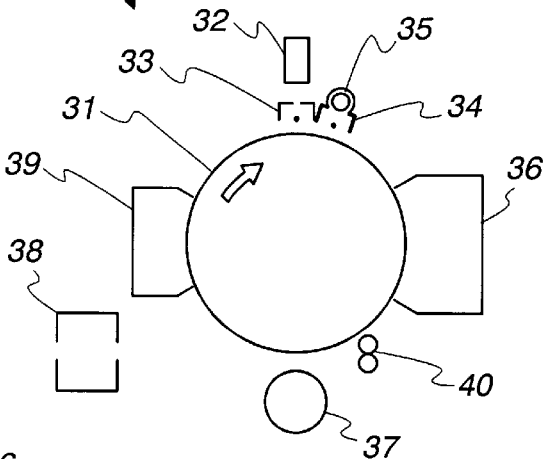
FIG. 10B schematically illustrates the electrophotographic apparatus during the discharging stage.

FIG. 10B shows a scheme of the electrophotographic apparatus 30 when performing the discharging process. At this stage, the discharging device 34 is in operation. The discharging device 34 is in the form of a wire electrizer connected to a high-voltage source of alternating voltage (not shown). The operational mode of the AC corona of the electrizer is selected in accordance with the frequency and amplitude such as to provide the discharging of the dielectric surface of the photoreceptor 31. In this case, the asymmetry of the AC corona with the symmetry of the amplitude of the supplied voltage is taken into account.

Figure 10C:
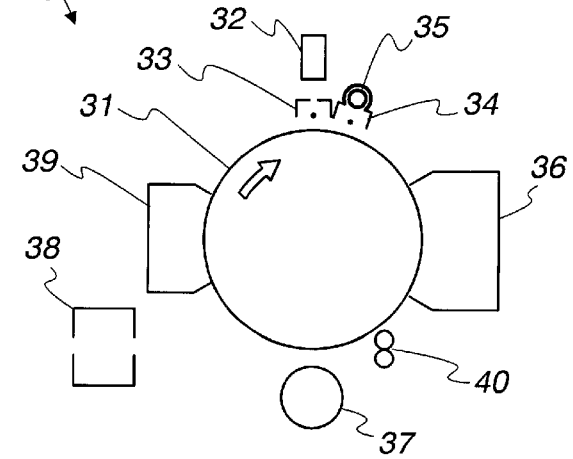
FIG. 10C schematically illustrates the electrophotographic apparatus during the final operation stage of the latent electrostatic image formation.

FIG. 10C shows the scheme of the electrophotographic apparatus 30 when performing the illumination process. At this stage, the illuminator 35 is in operation. After the flood illumination, the process of the latent electrostatic image formation on the dielectric surface of the photoreceptor 31 is completed. The possibility for the time separation of the stages of optical image scanning, discharging and illumination enables to select the optimal technological speeds for the process realization at these stages. Besides, it becomes possible to constructively combine the discharging electrizer 34 with the illuminator 35, thereby enabling their application for neutralizing the photoreceptor at the final operational stage of the apparatus 30.

Figure 10D:
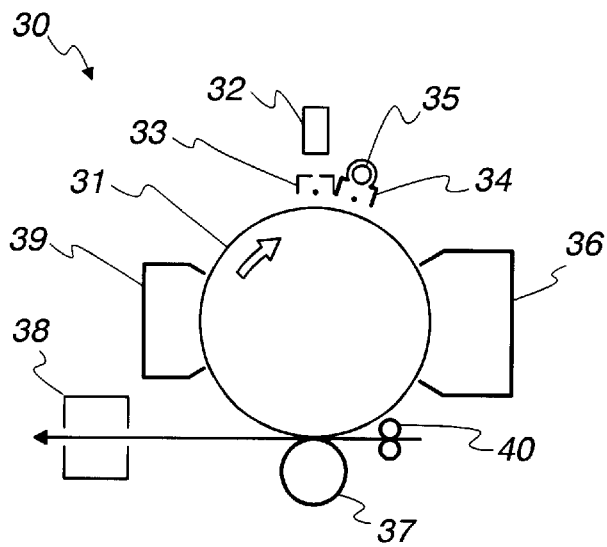
FIG. 10D schematically illustrates the electrophotographic apparatus during the multiple-copy production.

FIG. 10D shows the scheme of the electrophotographic apparatus 30 when performing the process of multiple-copy production. At this stage, the image development device 36, image transfer device 37, image fixation device 38 and transporting rollers 40 are in operation. The image development device 36 operates for developing by toner the latent electrostatic image formed on the dielectric surface of the photoreceptor 31. Concurrently, the transporting rollers 40 feed a copy material into the image transfer zone, in which the movable shaft 37 of the electrostatic transfer clamps this material to the cylindrical photoreceptor 31. Then, the copy is conveyed into the image fixation device 38, where the transferred toner-image is fixed on the information carrier. Thereafter, the cycle is repeated. A number of printing cycles is determined by the given number of copies to be produced in the multiple-copy production process.

Figure 10E:
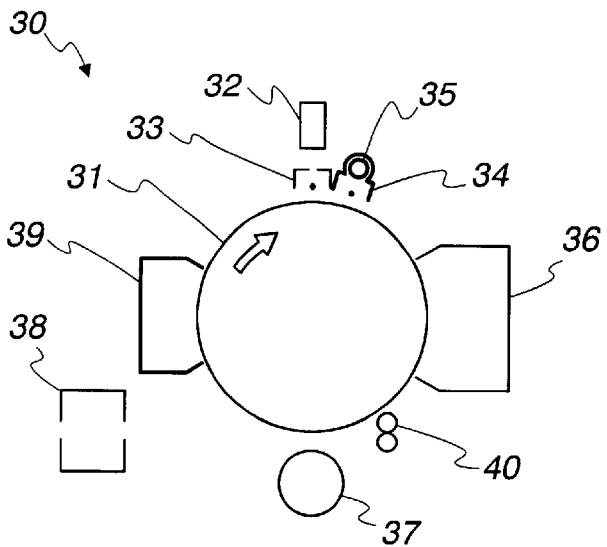
FIG. 10E schematically illustrates the operation of the electrophotographic apparatus after the completeness of the multiple-copy production.

FIG. 10E shows the scheme of the electrophotographic apparatus 30 while operating after the completeness of the multiple-copy production process. At this stage, the electrizer 34, illuminator 35 and cleaning device 39 are in operation. The full neutralization of the surface charges of the latent electrostatic image and compensating charges at the boundary photosemiconductor-dielectric is carried out by means of the operation of the symmetrical AC corona with the simultaneous illumination. Residuals of the toner image are removed from the surface of the photoreceptor 31 by means of the cleaning device 39. The apparatus is thus ready for the next cycle of copying.

Figure 11:
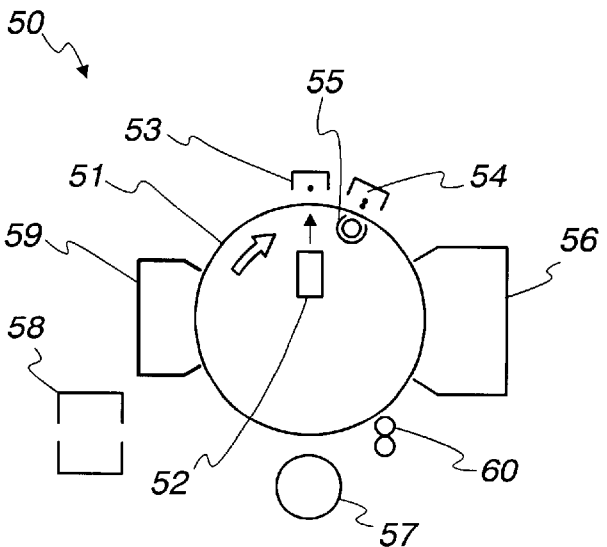
FIG. 11 schematically illustrates the electrophotographic apparatus with a photoreceptor made on a transparent base and having an opaque dielectric coating.

A photoreceptor with opaque dielectric coating, transparent base and a semi-transparent electrically conductive layer is also suitable to be used in the above-described examples of the photodielectric process of the latent electrostatic image formation. FIG. 11 illustrates the principal scheme of an electrophotographic apparatus 50 for multiple-copy production utilizing a photoreceptor 51 made on a transparent base and having opaque dielectric coating. This apparatus, similar to the previously described example, utilizes the combined photodielectric recording process. Here, however, in distinction to the previously described apparatus 30, a recording head 52 of the plotter and illuminator 55 are accommodated inside the cylindrical photoreceptor 51, and are arranged in radial superposition with respect to charging and discharging electrizers 53 and 54 accommodated above the dielectric surface of the photoreceptor 51. The operational principles of the apparatus 50 and the sequence of operational stages in the process of latent electrostatic image formation are similar to the previously described example.

The use of the photoreceptor 51 with the non-transparent dielectric coating enables the operation of the technological block of the apparatus in light. Furthermore, dielectric coatings having special properties can be applied, thus widening the functional possibilities of the equipment.

As indicated above, the use of a photoreceptor with a dielectric coating, that provides mechanical and electrical protection of the photosemiconductor layer, enables the direct contact electrostatic transfer of a toner-image onto an electrically conductive carrier.

Figure 12:
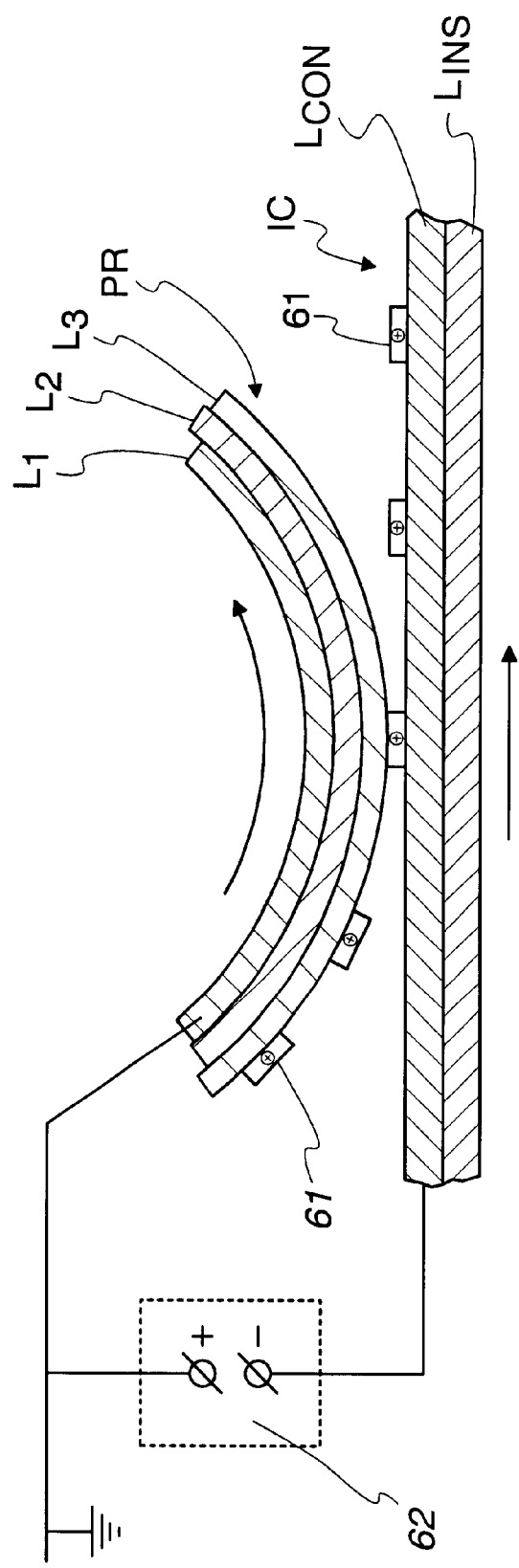
FIG. 12 illustrates the process of a contact electrostatic toner-image transfer from the surface of the laminated photoreceptor onto to the conductive information carrier.

FIG. 12 illustrates the process of contact electrostatic transfer of a toner-image 61 from the surface of a photoreceptor PR onto an electrically conductive information carrier IC, for example PCB The photoreceptor has a photosemiconductor layer $L_2$ located on a conductive substrate $L_1$ and laminated by a protective dielectric coating $L_3$. The electrically conductive information carrier IC is formed of an electrically conductive layer $L_{con}$ on an insulating carrying layer $L_{ing}$. The electrically conductive layer $L_{con}$ is coupled to a source of direct voltage 62. To transport the toner particles 61 from the surface of the photoreceptor PR onto the surface of the electrically conductive layer $L_{con}$, the supplied voltage should have polarity of the opposite sign with respect to that of the toner charge and such a magnitude that enables to overcome the forces attracting the toner particles to the dielectric surface of the photoreceptor. This means that the magnitude of the supplied voltage should exceed the potential level of recording of the latent electrostatic image. The upper value of the supplied voltage is limited, first, by the electrical strength of the working surface of the photoreceptor, the electrical strength depending on the material of a laminating film and its thickness. For example, when using polyethylene-terephthalate film having the thickness of 20–40 $\mu$m, the electrical strength of the photoreceptor is of several kilovolts, which is many times higher than the recording level. Second, during the transfer process the following condition should be satisfied: no electrical discharge disturbing the configuration of the transferring image appears between dielectric surface of the photoreceptor and electrically conductive material. Practically, the full transfer does not require the limit conditions to be satisfied.

One of the necessary conditions of the high quality transfer is also the provision of uniform clamping of the interacting surfaces. To this end, the clamping shaft 37 is used in the above-described scheme of FIGS. 10A–10E. The polyethylene-terephthalate laminating film possesses the mechanical strength and is also sufficiently elasticity to create the sufficient surface contact required for clamping the electrically conductive surface of PCB thereto during the transfer process.

The invented method enables the direct transfer of the toner-image from the surface of the photoreceptor onto the electrically conductive information carrier to be provided in simple and effective manner. This opens wide possibilities for operative and high-quality production of printed circuit boards, printing matrices and other products manufactured by photochemical methods utilizing etching of metal.

The contact electrostatic transfer can be carried out also on such an information carrier, whose electrically conductive surface is coated by a dielectric film having either technological or functional purposes. In this case, the transfer process is carried out in a manner similar to the above-described method. Moreover, when transferring a toner-image onto a dielectric information carrier (e.g., paper), a metal clamping/gripping shaft coupled to the source of direct voltage may serve as an electrically conductive element. This method of image transfer favors the implementation of the multiple-copy production process, in which the configuration of the latent electrostatic image should be maintained during the printing process.

Those skilled in the art will readily appreciate that various modifications and changes can be applied to the preferred embodiment as hereinbefore exemplified without departing from its scope defined in and by the appended claims.

What is claimed is:

1. A method of electrostatic recording of original information, the method comprising the following steps:
   (i) creating a latent electrostatic image of the original information on a cylindrical photoreceptor with a dielectric coating, the creation of the latent electrostatic image comprising:
      (a) charging the photoreceptor;
      (b) exposing the photoreceptor by means of an optical scanning of the surface of the photoreceptor along a helix line;
      (c) discharging the photoreceptor in darkness;
      (d) performing flood illumination of the photoreceptor; and
   (ii) developing the latent electrostatic image, and
   (iii) transferring the developed image onto a final information carrier.

2. The method according to claim 1, wherein the charging of the photoreceptor is performed in darkness up to a given potential level, during the entire period of the optical image scanning.

3. The method according to claim 2, wherein the exposure is performed in a charging zone.

4. The method according to claim 2, wherein the charging of the photoreceptor is performed by an AC corona with a basic amplitude bias defining magnitude and polarity of a desired charging.

5. The method according to claim 1, wherein the discharging in darkness is performed by an AC corona.

6. The method according to claim 5, wherein the charging of the photoreceptor is performed at light, while the discharging in darkness is performed after the charging step.

7. The method according to claim 6, wherein the charging is carried out during more than one revolutions of the photoreceptor.

8. The method according to claim 6, wherein the exposure is performed in a discharging zone.

9. The method according to claim 6, wherein the discharging is carried out during the entire period of the optical image scanning.

10. The method according to claim 1, wherein the developing of the latent electrostatic image is carried out by a toner.

11. The method according to claim 1, wherein the developed image is transferred onto the final information carrier having a dielectric surface.

12. The method according to claim 1, wherein the developed image is transferred onto the final information carrier having an electrically conductive surface.

13. The method according to claim 12, wherein the developed image is transferred onto the electrically conductive surface of the information carrier by direct electrostatic transfer.

14. The method according to claim 13, wherein the original information recorded is indicative of features of a printed circuit board.

15. An electrophotographic apparatus for carrying out the method of claim 1 for multiple-copy production of original information, the apparatus comprising:
   (i) a cylindrical photoreceptor with a dielectric coating of a photosemiconductor layer;
   (ii) a charging device for charging the photoreceptor;
   (iii) an exposure device for exposing the photoreceptor, said exposure device being of a kind capable of optical scanning of an image of copying information along a helix line;
   (iv) a discharging device for discharging the dielectric surface of the photoreceptor;
   (v) an illumination device for illuminating the photosemiconductor layer;
   (vi) a development device for developing a latent electrostatic image by a toner;
   (vii) a transfer device for transferring a toner-image onto a final information carrier;
   (viii) a fixation device for image fixation on the copy; and
   (ix) a cleaning device for cleaning the dielectric surface of the photoreceptor.

16. The apparatus according to claim 15, wherein the charging device is a wire electrizer coupled to a source of alternating voltage with basic bias, defining a given potential level of charging.

17. The apparatus according to claim 15, wherein the discharging device is a wire electrizer coupled to a source of alternating voltage.

18. The apparatus according to claim 15, operating in a cyclic mode having the following cycles:
   optical recording, by simultaneous operation of the charging and exposure devices;
   revealing a potential relief, by sequential operation of the discharging and illumination devices;
   multiple-copy production, by operation of the development, transfer and fixation devices; and
   restoration, by operating neutralizing and cleaning means.

19. The apparatus according to claim 18, wherein the charging device is accommodated in an exposure zone.

20. The apparatus according to claim 18, wherein the discharging and illumination devices serve as the neutralizing means.

21. The apparatus according to claim 15, operating in a cyclic mode with the following cycles:
   charging the photoreceptor under light, by simultaneous operation of the charging device and an additional illumination device;
   optical recording; by simultaneous operation of the discharging and exposure devices;
   revealing of a potential relief, by operating the illumination device;
   multiple-copy production, by operation of the development, transfer and fixation devices; and
   restoration, by operation of the neutralizing and cleaning means.

22. The apparatus according to claim 21, wherein the discharging device is accommodated in an exposure zone.

23. The apparatus according to claim 21, wherein the charging device and the additional lighting device operate during more than one revolutions of the photoreceptor.

* * * * *

UNITED STATES PATENT AND TRADEMARK OFFICE
CERTIFICATE OF CORRECTION

PATENT NO. : 6,440,625 B1
DATED : August 27, 2002
INVENTOR(S) : Genady Berlin

It is certified that error appears in the above-identified patent and that said Letters Patent is hereby corrected as shown below:

<u>Title page,</u>
Insert Item:
-- [30]  Foreign Application Priority Data
      January 28, 1999 (IL)...................128297
      June 13, 1999  (IL) ....................130441 --

Signed and Sealed this

Fourteenth Day of September, 2004

JON W. DUDAS
*Director of the United States Patent and Trademark Office*